(12) United States Patent
Kotov et al.

(10) Patent No.: US 8,883,592 B2
(45) Date of Patent: Nov. 11, 2014

(54) NON-VOLATILE MEMORY CELL HAVING A HIGH K DIELECTRIC AND METAL GATE

(75) Inventors: Alexander Kotov, San Jose, CA (US); Chien-Sheng Su, Saratoga, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 13/559,329

(22) Filed: Jul. 26, 2012

(65) Prior Publication Data

US 2013/0032872 A1 Feb. 7, 2013

Related U.S. Application Data (60) Provisional application No. 61/515,589, filed on Aug. 5, 2011.

(51) Int. Cl.
| | | |
|---|---|---|
| H01L 21/336 | (2006.01) | |
| H01L 29/788 | (2006.01) | |
| H01L 27/115 | (2006.01) | |
| H01L 21/28 | (2006.01) | |
| H01L 29/423 | (2006.01) | |

(52) U.S. Cl.
CPC .... *H01L 27/11521* (2013.01); *H01L 21/28273* (2013.01); *H01L 29/42328* (2013.01); *H01L 29/7881* (2013.01)
USPC ....... 438/267; 257/315; 257/316; 365/185.01

(58) Field of Classification Search
None
See application file for complete search history.

(56) References Cited

U.S. PATENT DOCUMENTS

| | | | |
|---|---|---|---|
| 6,198,144 B1 | 3/2001 | Pan et al. | |
| 6,579,783 B2 | 6/2003 | Saigal et al. | |
| 6,798,026 B2 | 9/2004 | Hu et al. | |
| 7,208,793 B2 | 4/2007 | Bhattacharyya | |
| 2002/0019119 A1* | 2/2002 | Saigal et al. | 438/581 |
| 2006/0110870 A1* | 5/2006 | Bhattacharyya | 438/197 |
| 2007/0026621 A1 | 2/2007 | Cho et al. | |
| 2008/0009115 A1* | 1/2008 | Willer et al. | 438/257 |
| 2009/0152636 A1* | 6/2009 | Chudzik et al. | 257/369 |
| 2009/0207662 A1* | 8/2009 | Wang et al. | 365/185.18 |
| 2011/0049603 A1* | 3/2011 | Pan et al. | 257/316 |

OTHER PUBLICATIONS

PCT Search Report and Written Opinion dated Oct. 9, 2012 corresponding to the related PCT Patent Application No. US12/048603.

* cited by examiner

*Primary Examiner* — Julio J Maldonado
*Assistant Examiner* — Joseph Galvin, III
(74) *Attorney, Agent, or Firm* — DLA Piper LLP (US)

(57) ABSTRACT

A non-volatile memory including a substrate of a first conductivity type with first and second spaced apart regions formed therein of a second conductivity type with a channel region therebetween. A polysilicon metal gate word line is positioned over a first portion of the channel region and spaced apart therefrom by a high K dielectric layer. The metal portion of the word line is immediately adjacent to the high K dielectric layer. A polysilicon floating gate is immediately adjacent to and spaced apart from the word line, and positioned over and insulated from another portion of the channel region. A polysilicon coupling gate is positioned over and insulated from the floating gate. A polysilicon erase gate is positioned on another side of and insulated from the floating gate, positioned over and insulated from the second region, and immediately adjacent to but spaced apart from another side of the coupling gate.

18 Claims, 6 Drawing Sheets

NON-VOLATILE MEMORY CELL HAVING A HIGH K DIELECTRIC AND METAL GATE

RELATED APPLICATIONS

This application claims the benefit of U.S. Provisional Application No. 61/515,589, filed Aug. 5, 2011.

TECHNICAL FIELD

The present invention relates to a non-volatile memory cell having a metal gate as a part of the word line and a high k dielectric between the word line and the channel region.

BACKGROUND OF THE INVENTION

Figure 1:
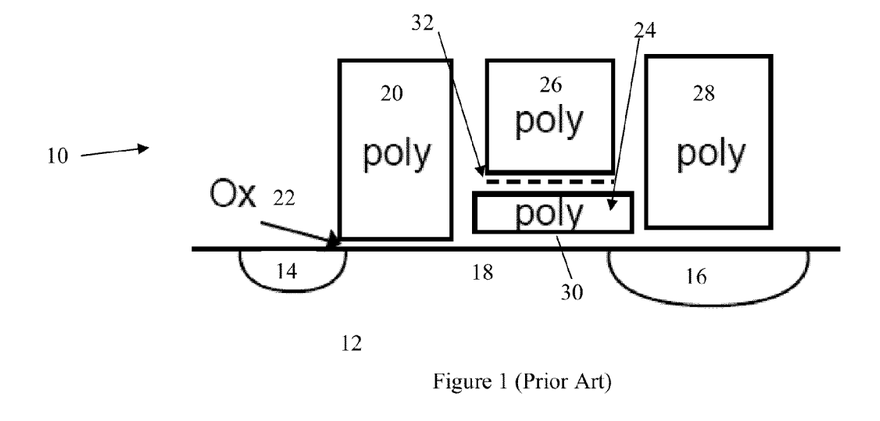
FIG. 1 is a cross-sectional view of a flash memory cell of the prior art.

A non-volatile memory cell using a floating gate to store charges is well known in the art. Referring to FIG. 1 there is shown a cross-sectional view of a non-volatile memory cell 10 of the prior art. The memory cell 10 comprises a single crystalline substrate 12, of a first conductivity type, such as P type. At or near a surface of the substrate 12 is a first region 14 of a second conductivity type, such as N type. Spaced apart from the first region 14 is a second region 16 also of the second conductivity type. Between the first region 14 and the second region 16 is a channel region 18. A word line 20, made of polysilicon is positioned over a first portion of the channel region 18. The word line 20 is spaced apart from the channel region 18 by a silicon (di)oxide layer 22. Immediately adjacent to and spaced apart from the word line 20 is a floating gate 24, which is also made of polysilicon, and is positioned over another portion of the channel region 18. The floating gate 24 is separated from the channel region 18 by another insulating layer 30, typically also of silicon (di)oxide. A coupling gate 26, also made of polysilicon is positioned over the floating gate 24 and is insulated therefrom by another composite insulating layer 32. A typical material for the composite insulating layer 32 is silicon-dioxide-silicon nitride-silicon dioxide or ONO. On another side of the floating gate 24, and spaced apart therefrom, is an erase gate 28, also made of polysilicon. The erase gate 28 is positioned over the second region 16 and is insulated therefrom. The erase gate 28 is also immediately adjacent to but spaced apart from the coupling gate 26 and to another side of the coupling gate 26.

The memory cell 10 operates as follows. During the programming operation, when charges are stored on the floating gate 24, a first positive voltage is applied to the word line 20 causing the portion of the channel region 18 under the word line 20 to be conductive. A second positive voltage is applied to the coupling gate 26. A third positive voltage is applied to the second region 16. Current is applied to the first region 14. The electrons are attracted to the positive voltage at the second region 16. As they near the floating gate 24, they experience a sudden increase in the electric field caused by the voltage applied to the coupling gate 26, causing the charges to be injected onto the floating gate 24. Thus, programming occurs through the mechanism of hot electron injection. During the erase operation when charges are removed from the floating gate 24, a high positive voltage is applied to the erase gate 28. A negative voltage or ground voltage can be applied to the coupling gate 26 and/or the word line 20. Charges on the floating gate 24 are attracted to the erase gate 28 by tunneling through the insulating layer between the floating gate 24 and the erase gate 28. In particular, the floating gate 24 may be formed with a sharp tip facing the erase gate 28, thereby facilitating the Fowler-Nordheim tunneling of electrons from the floating gate 24 through the tip and through the insulating layer between the floating gate 24 and the erase gate 28 onto the erase gate 28. During the read operation, a first positive voltage is applied to the word line 20 to turn on the portion of the channel region 18 beneath the word line 20. A second positive voltage is applied to the coupling gate 26. A voltage differential is applied to the first region 14 and the second region 16. If the floating gate 24 were programmed, i.e. the floating gate 24 stores electrons, then the second positive voltage applied to the coupling gate 26 is not able to overcome the negative electrons stored on the floating gate 24 and the portion of the channel region 18 beneath the floating gate 24 remains non-conductive. Thus, no current or a minimal amount of current would flow between the first region 14 and the second region 16. However, if the floating gate 24 were not programmed, i.e. the floating gate 24 remains neutral or perhaps even stores positive charges (lack of electrons), then the second positive voltage applied to the coupling gate 26 is able to cause the portion of the channel region 18 beneath the floating gate 24 to be conductive. Thus, a current would flow between the first region 14 and the second region 16.

The memory cell 10 has thus far proven to be viable for process nodes in the 90 nm range. However, as scaling increases, i.e. process geometry decreases, scaling will become a challenge due to the thickness of the word line oxide layer 22, being unscalable. This can cause leakage through the oxide layer 22, which can trigger programming disturb conditions. In addition, if the oxide layer 22 is unscalable, it can be challenging to read with a Vcc of 1.2 volts and below, necessitating the use of charge pumps, which can cause slower read, read latency, as well as taking valuable real estate for the charge pump. Furthermore, this can cause a high subthreshold cell current through the channel region 18 beneath the word line 20 in the erased state of the unselected memory cell 10, challenging high temperature operation for program, read and program disturb. Thus, it is desirable to find a solution to the problem of process scaling so that the memory cell 10 can be scaled to smaller geometries without departing radically from the design of the memory cell 10.

SUMMARY OF THE INVENTION

Accordingly, in a first embodiment of the present invention, a non-volatile flash memory cell has a single crystalline substrate, of a first conductivity type, such as P type. At or near a surface of the substrate is a first region of a second conductivity type, such as N type. Spaced apart from the first region is a second region also of the second conductivity type. Between the first region and the second region is a channel region. A word line, made of polysilicon and metal gate is positioned over a first portion of the channel region. The word line is spaced apart from the channel region 18 by a high K dielectric layer. The metal portion of the word line is immediately adjacent to the high K dielectric layer. Immediately adjacent to and spaced apart from the word line is a floating gate, which is also made of polysilicon, and is positioned over another portion of the channel region. The floating gate is separated from the channel region by another insulating layer, typically also of silicon (di)oxide. A coupling gate, also made of polysilicon is positioned over the floating gate and is insulated therefrom by another insulating layer. On another side of the floating gate, and spaced apart therefrom, is an erase gate, also made of polysilicon. The erase gate is positioned over the second region and is insulated therefrom. The erase gate is also immediately adjacent to but spaced apart from the coupling gate and to another side of the coupling gate.

In a second embodiment of the present invention, the memory cell is similar to the first embodiment, except the second embodiment memory cell further has a high K dielectric material along the side wall of the word line between the word line and the adjacent floating gate and the coupling gate, with the metal portion of the word line further being adjacent to the high K dielectric along the side wall of the word line.

In a third embodiment of the present invention, the memory cell is similar to the second embodiment except the third embodiment memory cell further has a high K dielectric material along the side wall of the erase gate between the erase gate and the adjacent floating gate and the coupling gate, with the metal portion of the erase gate being adjacent to the high K dielectric material along the side wall of the erase gate. The erase gate further has a high K dielectric layer between the erase gate and the second region, with the metal portion of the erase gate being adjacent to the high K dielectric layer between the erase gate and the second region.

BRIEF DESCRIPTION OF THE DRAWINGS

FIG. 5(a-g) are cross sectional views of the steps used in the process flow of the present invention to make the third embodiment of the flash memory cell of the present invention.

DETAILED DESCRIPTION OF THE PREFERRED EMBODIMENT

Figure 2:
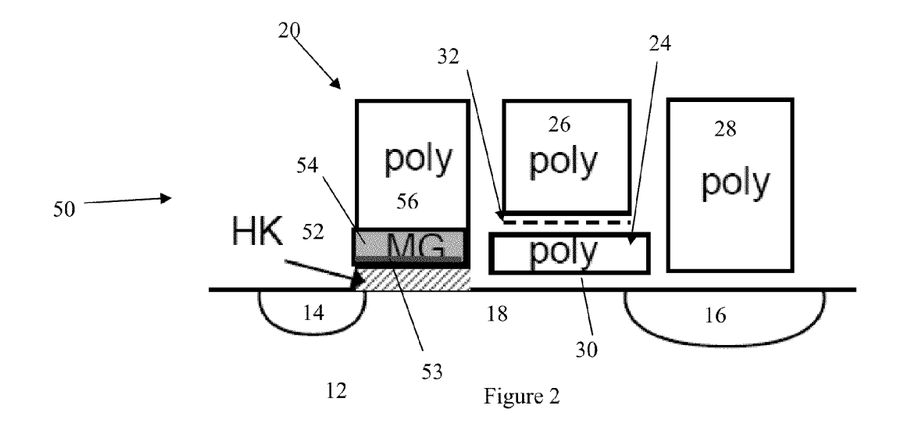
FIG. 2 is a cross-sectional view of a first embodiment of the flash memory cell of the present invention.

Referring to FIG. 2 there is shown a first embodiment of the memory cell 50 of the present invention. The memory cell 50 is similar to the memory cell 10 shown in FIG. 1. Thus, like parts will be designated with the same numeral. The memory cell 50 comprises a single crystalline substrate 12, of a first conductivity type, such as P type. At or near a surface of the substrate 12 is a first region 14 of a second conductivity type, such as N type. Spaced apart from the first region 14 is a second region 16 also of the second conductivity type. Between the first region 14 and the second region 16 is a channel region 18. A word line 20 is positioned over a first portion of the channel region 18. The word line 20 is spaced apart from the channel region 18 by a high K dielectric layer 52. A typical material for the high K dielectric layer 52 is hafnium dioxide. A capping layer 53, such as Lanthanum Oxide ($La_2O_3$), may be deposited by Atomic Layer deposition (ALD) on the high K dielectric layer 52. The word line 20 comprises two parts: a first part 54 which is made of a metal material, such as titanium nitride is immediately adjacent to the high K dielectric layer 52 (or adjacent to the capping layer 53), and a second part 56 which is made of polysilicon. Collectively, the first part 54 and the second part 56 form the word line 20. The purpose of the capping layer 53 is to achieve flat band voltage shift close to the word line 20 NMOS target work function. Immediately adjacent to and spaced apart from the word line 20 is a floating gate 24, which is also made of polysilicon, and is positioned over another portion of the channel region 18. The floating gate 24 is separated from the channel region 18 by another insulating layer 30, typically also of silicon (di)oxide. A coupling gate 26, also made of polysilicon is positioned over the floating gate 24 and is insulated therefrom by another insulating layer 32. On another side of the floating gate 24, and spaced apart therefrom, is an erase gate 28, also made of polysilicon. The erase gate 28 is positioned over the second region 16 and is insulated therefrom. The erase gate 28 is also immediately adjacent to but spaced apart from the coupling gate 26 and to another side of the coupling gate 26.

Figure 3:
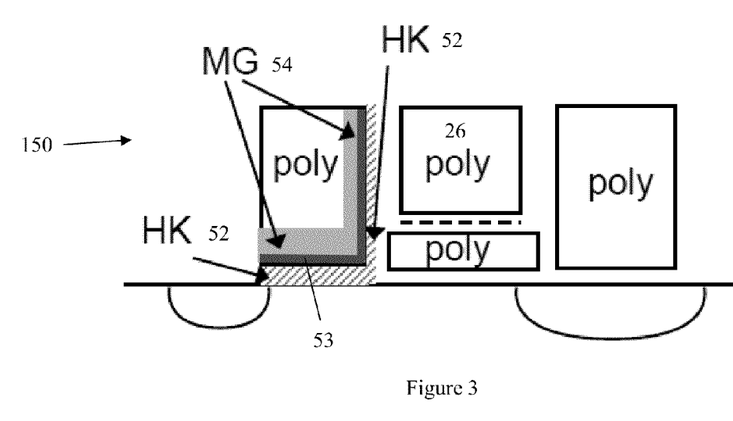
FIG. 3 is a cross-sectional view of a second embodiment of the flash memory cell of the present invention.

Referring to FIG. 3 there is shown a second embodiment of the memory cell 150 of the present invention. The memory cell 150 is similar to the memory cell 50 shown in FIG. 2. Thus, like parts will be designated with the same numeral. The memory cell 150 comprises a single crystalline substrate 12, of a first conductivity type, such as P type. At or near a surface of the substrate 12 is a first region 14 of a second conductivity type, such as N type. Spaced apart from the first region 14 is a second region 16 also of the second conductivity type. Between the first region 14 and the second region 16 is a channel region 18. A word line 20 is positioned over a first portion of the channel region 18. The word line 20 is spaced apart from the channel region 18 by a high K dielectric layer 52. A typical material for the high K dielectric layer 52 is hafnium dioxide. A capping layer 53, such as Lanthanum Oxide ($La_2O_3$), may be deposited by Atomic Layer deposition (ALD) on the high K dielectric layer 52. The word line 20 comprises two parts: a first part 54 which is made of a metal material, such as titanium nitride, is immediately adjacent to the high K dielectric layer 52 (or adjacent to the capping layer 53), and a second part 56 which is made of polysilicon. Collectively, the first part 54 and the second part 56 form the word line 20. The purpose of the capping layer 53 is to achieve flat band voltage shift close to the word line 20 NMOS target work function. Immediately adjacent to and spaced apart from the word line 20 is a floating gate 24, which is also made of polysilicon, and is positioned over another portion of the channel region 18. The floating gate 24 is separated from the channel region 18 by another insulating layer 30, typically also of silicon (di)oxide. A coupling gate 26, also made of polysilicon is positioned over the floating gate 24 and is insulated therefrom by another insulating layer 32. The word line 20 is also spaced apart from the floating gate 24 and the coupling gate 26 by the layer 52 of high K dielectric material (and another capping layer 53). Further, the metal layer 54 also extends along the side wall of the word line 20 and is immediately adjacent to the high K dielectric layer 52 (or adjacent to the capping layer 53) along the side of the word line 20. Thus, the high K dielectric layer is along the bottom of the word line 20 and is adjacent to the word line 20. A capping layer 53 may also be between and the high K layer 52 and the word line 20. Finally, a metal gate 54 is along the bottom and the side wall of the word line 20. On another side of the floating gate 24, and spaced apart therefrom, is an erase gate 28, also made of polysilicon. The erase gate 28 is positioned over the second region 16 and is insulated therefrom. The erase gate 28 is also immediately adjacent to but spaced apart from the coupling gate 26 and to another side of the coupling gate 26.

Figure 4:
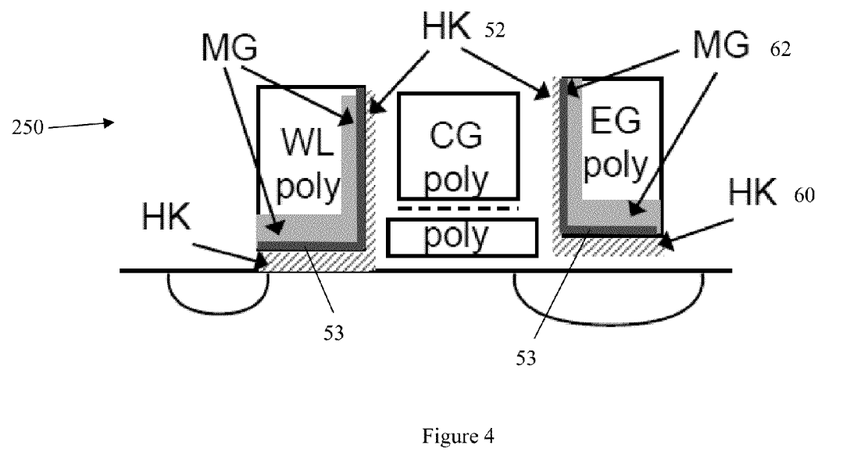
FIG. 4 is a cross-sectional view of a third embodiment of the flash memory cell of the present invention.

Referring to FIG. 4 there is shown a third embodiment of the memory cell 250 of the present invention. The memory cell 250 is similar to the memory cell 150 shown in FIG. 3. Thus, like parts will be designated with the same numeral. The memory cell 250 comprises a single crystalline substrate 12, of a first conductivity type, such as P type. At or near a surface of the substrate 12 is a first region 14 of a second conductivity type, such as N type. Spaced apart from the first region 14 is a second region 16 also of the second conductivity type. Between the first region 14 and the second region 16 is a channel region 18. A word line 20 is positioned over a first portion of the channel region 18. The word line 20 is spaced apart from the channel region 18 by a high K dielectric layer 52. A typical material for the high K dielectric layer 52 is hafnium dioxide. A capping layer 53 may be on the high K dielectric layer 52. The word line 20 comprises two parts: a first part 54 which is made of a metal material, such as titanium nitride, is immediately adjacent to the high K dielectric layer 52 (or adjacent to the capping layer 53), and a second part 56 which is made of polysilicon. Collectively, the first part 54 and the second part 56 form the word line 20. Immediately adjacent to and spaced apart from the word line 20 is a floating gate 24, which is also made of polysilicon, and is positioned over another portion of the channel region 18. The floating gate 24 is separated from the channel region 18 by another insulating layer 30, typically also of silicon (di) oxide. A coupling gate 26, also made of polysilicon is positioned over the floating gate 24 and is insulated therefrom by another insulating layer 32. The word line 20 is also spaced apart from the floating gate 24 and the coupling gate 26 by the layer 52 of high K dielectric material. Further, the capping layer 53 may also be between the word line 20 and the adjacent high K layer 52. the metal layer 54 also extends along the side wall of the word line 20 and is immediately adjacent to the high K dielectric layer 52 (or adjacent to the capping layer 53) along the side of the word line 20. Thus, the metal gate 54 is along the bottom and the side wall of the word line 20. On another side of the floating gate 24, and spaced apart therefrom, is an erase gate 28. The erase gate 28 is positioned over the second region 16 and is insulated therefrom by a layer of high K dielectric material 60, which can be of the same high K dielectric material 52. A capping layer 53 may also be between the erase gate 28 and the high K layer 60. The erase gate 28 is also immediately adjacent to but spaced apart from the coupling gate 26 and to another side of the coupling gate 26. Between the erase gate 28 and the floating gate 24 and the coupling gate 26 is another layer of high K dielectric material 60, which also can be of the same material as the high K dielectric material 52. Another capping layer 53 may also be between the erase gate 28 and the adjacent high K dielectric layer 60, which is adjacent to the floating gate 24 and the coupling gate 26. The erase gate 28 comprises two parts: a metal gate 62 which is along the bottom of the erase gate 28 and immediately adjacent to the high K dielectric layer 60 (or adjacent to the capping layer 53) and along the side wall of the erase gate 28 immediately adjacent to the high K dielectric layer 60 (or adjacent to the capping layer 53) between the erase gate 62 and the floating gate 24 and the coupling gate 26.

A method of manufacturing the memory cell 250 of the present invention, will now be described. The process begins with the following steps which are the same processing steps used to make the memory cell 10 shown in FIG. 1.

Figure 5A:
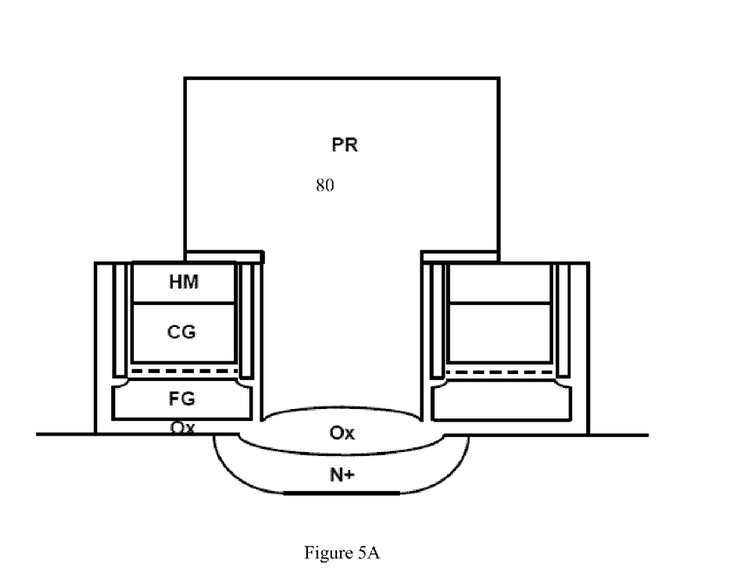

1. DIFF Masking & Etching—this includes Shallow Trench Isolation formation and Pad nitride removal
2. Floating Gate Oxide, Polysilicon deposition and Polysilicon Implant.
3. Floating Gate Polysilicon planarization
4. MCEL Masking and Polysilicon etch back
5. ONO & control Gate Stack Formation
6. Control Gate Masking and Etching
7. Control Gate S/W Spacer Formation
8. Floating Gate Polysilicon Etching
9. MCEL-2 Masking & Word line Vt Implant
10. Floating Gate High Temperature Oxide Spacer Formation
11. High Voltage Oxide Deposition
12. HVII Masking, HVII Implant and Oxide Etch
13. Tunnel Oxide Formation
14. LVOX Masking and Oxide Etching The resultant structure is shown in FIG. 5A. The photoresist 80 is removed. An optional oxide layer may then be applied to the structure. Thereafter, a layer 22 of high K dielectric material is then applied. The process can be done by Atomic Layer Deposition (ALD) of high-K dielectric material, including but not limited to hafnium dioxide, hafnium silicate, zirconium dioxide and zirconium silicate. A capping layer 53, such as Lanthanum Oxide ($La_2O_3$), may be deposited by Atomic Layer deposition (ALD) on the high K dielectric layer 52. A layer of metal 54 is then deposited. This can be done by Phase Vapor Deposition (PVD) of metal gate material followed by high temperature anneal by Rapid Thermal Process (RTP). The resultant structure is shown in FIG. 5B.

Figure 5B:
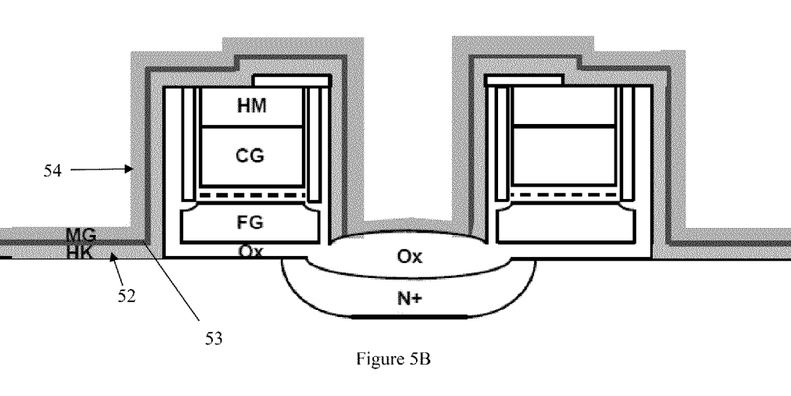

A polysilicon layer 82 is then deposited over the structure shown in FIG. 5B. An implant of phosphorus or arsenic is then made onto the polysilicon layer 82. This can be done by implanting N+ dopants, such as phosphorus or arsenic into the polysilicon layer followed by high temperature anneal by RTP. The resulting structure is shown in FIG. 5C.

Figure 5C:
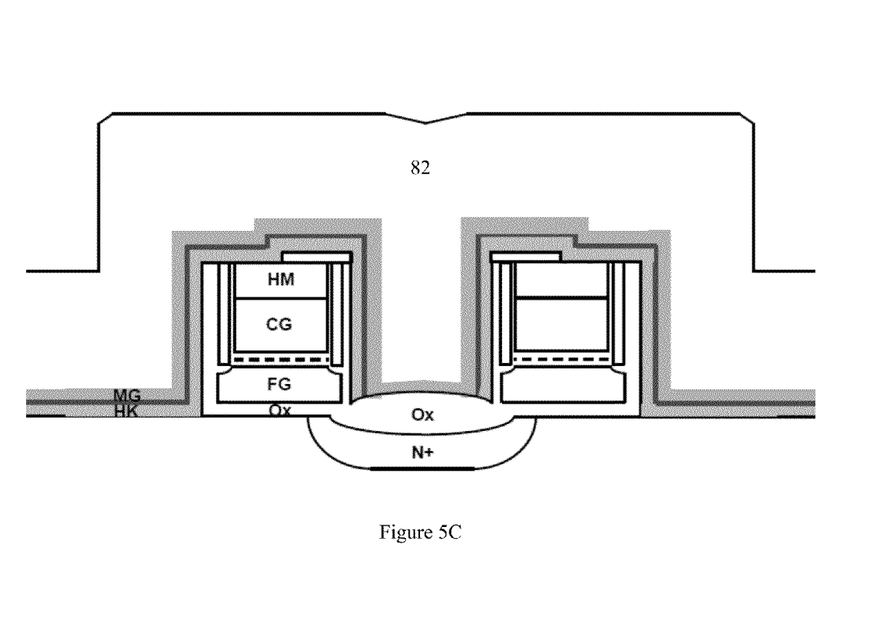

The structure shown in FIG. 5C is then subject to a CMP (Chemical-Mechanical Polishing) etch process. The resultant structure is shown in FIG. 5D.

Figure 5D:
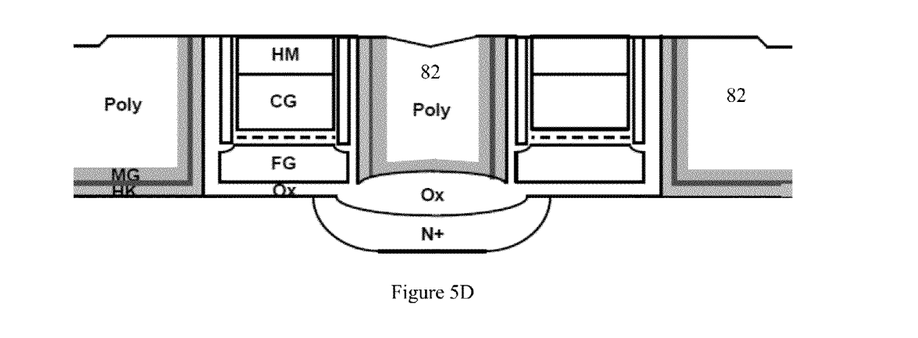
Figure 5E:
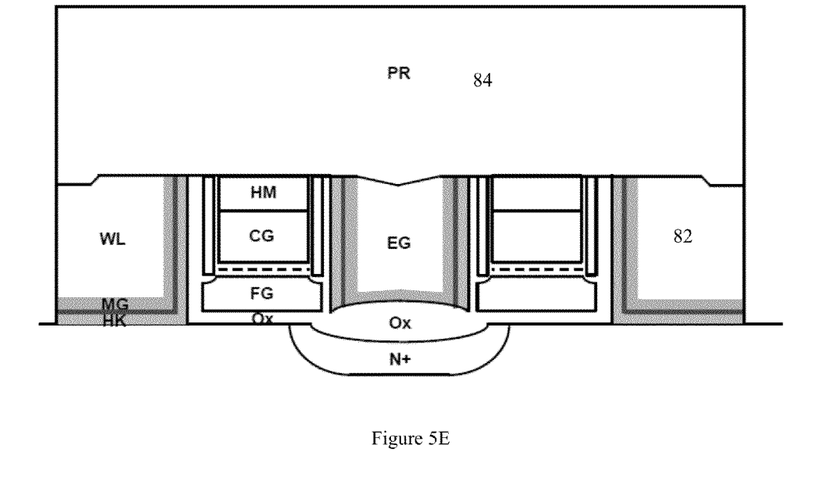

The structure shown in FIG. 5D is subject to a masking step by applying a mask with a photoresist 84 so that the polysilicon layer 82 may be etched. The resultant structure is shown in FIG. 5E.

Figure 5F:
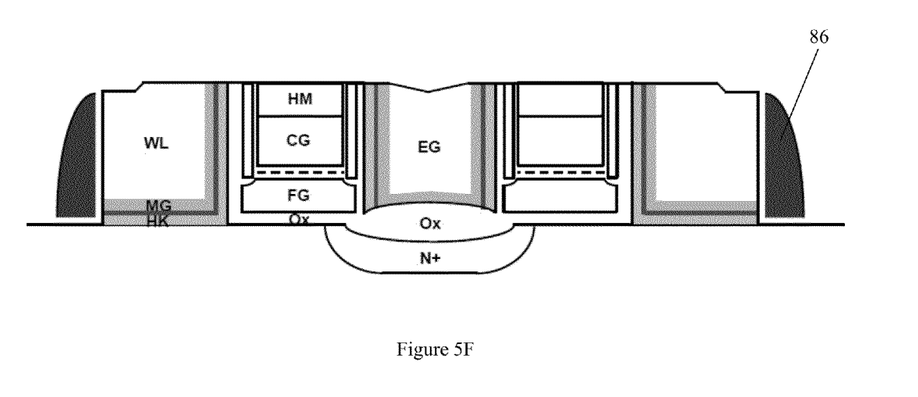

The photoresist 84 is removed. Silicon dioxide spacers 86 are formed, by applying a layer of silicon dioxide, followed by an anisotropic etch thereof. The resultant structure is shown in FIG. 5F.

NNII (N+) masking and NNII (N+) implant are performed. The result is the formation of the first regions 14. The resultant structure is shown in FIG. 5G.

Figure 6:
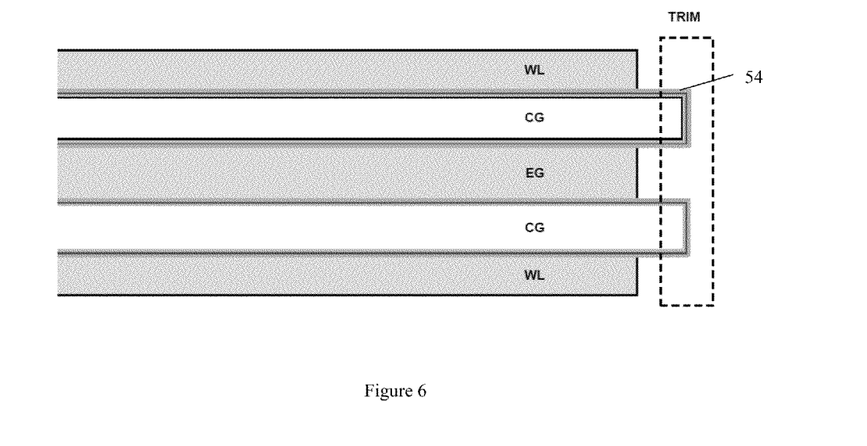
FIG. 6 is a top view of one of the steps used in the process flow of the present invention.

The metal layer 54 which is deposited on the capping layer 53 and on the high K dielectric layer 52 (if there is no capping layer 53) is also deposited along the sidewall of the floating gate 24 and the coupling gate 26 as shown in FIG. 5B. A trim mask is used to open the end of the coupling gate 26 and trim off the metal gate 54 so that the word line 20 will no be shorted to either the erase gate 28 or to the other word lines 20. This is shown in FIG. 6, which is a top view of the structure, showing the location where the trimming of the metal layer 54 occurs.

Figure 5G:
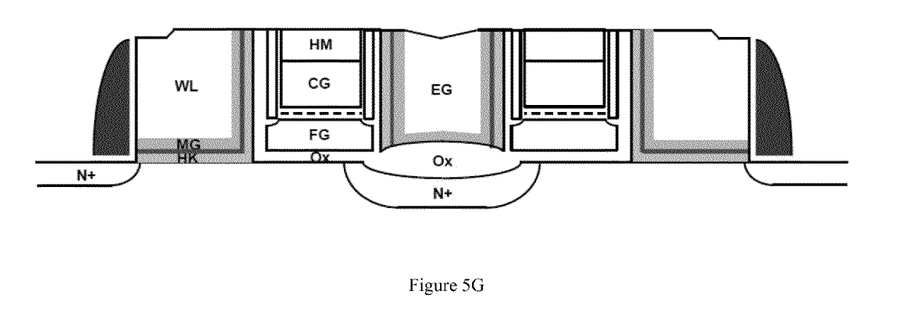

After the formation of the structure shown in FIG. 5G, the following process steps are performed. These process steps are the same process steps used in the formation of the memory cell 10 shown in FIG. 1.

1. PPII (P+) Masking and PPII (P+) Implant
2. CGCT Masking and Etching
3. Salicide formation—on Word line polysilicon 56, Erase Gate polysilicon 28, Bit line silicon (not shown), High Voltage/logic gate polysilicon (not shown), and high voltage/logic diffusion areas (not shown).
4. ILD Deposition and CMP
5. CONT Masking
6. MTL1 Masking
7. VIA 1 Masking
8. MTL2 Masking
9. BPAD Masking
10. APAD Masking
11. BPAD Masking

What is claimed is:

1. A non-volatile memory cell comprising:
a substantially single crystalline semiconductor substrate of a first conductivity type;
a first region of a second conductivity type along a surface of the substrate;
a second region of the second conductivity type along the surface of the substrate, spaced apart from the first region;
a channel region between the first region and the second region in the substrate along the surface thereof; said channel region having a first portion and a second portion, with the first portion adjacent to the first region;
a word line having a bottom and a side, with the bottom spaced apart from the first portion of the channel region; said word line comprising a polysilicon portion and a metal portion with the metal portion along the bottom of the word line closest to the first portion of the channel region;
a high K dielectric insulator between the bottom of the word line and the first portion of the channel region;
a floating gate spaced apart from the second portion of the channel region and spaced apart and adjacent to the word line;
a coupling gate spaced apart from the floating gate and spaced apart and adjacent to the word line; and
an erase gate spaced apart from the second region, said erase gate adjacent to and spaced apart from the coupling gate and the floating gate;
wherein said metal portion of said word line extends along the side of the word line and is between the polysilicon portion and the floating gate and the coupling gate;
wherein said high K dielectric insulator extends along the side of the word line and is between the metal portion and the floating gate and the coupling gate.

2. The memory cell of claim 1 wherein said high K dielectric insulator comprises a material selected from hafnium dioxide, hafnium silicate, zirconium dioxide and zirconium silicate.

3. The memory cell of claim 2 wherein said metal portion comprises titanium nitride.

4. The memory cell of claim 3 wherein said metal portion further comprises a capping layer.

5. The memory cell of claim 4 wherein said capping layer comprises lanthanum oxide.

6. The memory cell of claim 1 wherein said erase gate has a bottom and a side and comprises a polysilicon portion and a metal portion with the metal portion along the side of the erase gate between the erase gate and the floating gate and the coupling gate and along the bottom of the erase gate closest to the second region;
a high K dielectric insulator between the metal portion of the erase gate along the side thereof and the floating gate and the coupling gate and between the metal portion along the bottom of the erase gate and the second region.

7. The memory cell of claim 6 wherein said high K dielectric insulator comprises a material selected from hafnium dioxide, hafnium silicate, zirconium dioxide and zirconium silicate.

8. The memory cell of claim 7 wherein said metal portion comprises titanium nitride.

9. The memory cell of claim 8 wherein said metal portion further comprises a capping layer.

10. The memory cell of claim 9 wherein said capping layer comprises lanthanum oxide.

11. A method of forming a non-volatile memory cell on a substantially single crystalline semiconductor substrate of a first conductivity type, having a first region of a second conductivity along a surface of the substrate, said method comprising:
forming a stacked gate structure on the surface of said substrate, adjacent to the first region, said stacked gate structure having two sidewalls, a first sidewall and a second sidewall, said stacked gate structure comprising a floating gate insulated from the surface of the substrate, and a coupling gate on said floating gate and insulated therefrom;
depositing a layer of high K dielectric material over said stacked gate structure and over said substrate; said high K dielectric material being formed along the first sidewall and the second sidewall and is adjacent thereto, and on the surface of said substrate adjacent to the stacked gate structure;
depositing a metal layer immediately adjacent to the high K dielectric layer, said metal layer formed along the first sidewall and the second sidewall and is immediately adjacent to the high K dielectric layer, and on said high K dielectric layer over the surface of said substrate adjacent to the stacked gate structure;
forming a first polysilicon gate immediately adjacent to the metal layer on one side of the stacked gate structure, and over the substrate, and insulated therefrom;
forming a second polysilicon gate immediately adjacent to the metal layer on another side of the stacked gate structure, and over the first region and insulated therefrom; and
forming a second region in said substrate immediately adjacent to the first polysilicon gate.

12. The method of claim 11 wherein said first polysilicon gate and second polysilicon gate are formed in the same step.

13. The method of claim 12 wherein said high K dielectric material comprises a material selected from hafnium dioxide, hafnium silicate, zirconium dioxide and zirconium silicate.

14. The method of claim 13 wherein said metal layer comprises titanium nitride.

15. The method of claim 14 wherein said metal layer further comprises a capping layer.

16. The method of claim 15 wherein said capping layer comprises lanthanum oxide.

17. The method of claim 12 wherein said stacked gate structure further having a top surface, between the first sidewall and the second sidewall, wherein said high K dielectric material is deposited on said top surface, and said metal layer is deposited on the high K dielectric material on the top surface, and
wherein said first polysilicon gate and second polysilicon gate are formed in the same step by depositing a layer of polysilicon over the top surface of the stacked gate structure, adjacent to the first and second sidewalls of the stacked gate structure, and on the substrate.

18. The method of claim 17 further comprising a removal step to remove the polysilicon, the high K dielectric material and the metal layer on the top surface of the stacked gate structure to form the first polysilicon gate and the second polysilicon gate.

* * * * *